United States Patent [19]

Estakhri

[11] Patent Number: 6,040,997
[45] Date of Patent: Mar. 21, 2000

[54] FLASH MEMORY LEVELING ARCHITECTURE HAVING NO EXTERNAL LATCH

[75] Inventor: Petro Estakhri, Pleasanton, Calif.

[73] Assignee: Lexar Media, Inc., Fremont, Calif.

[21] Appl. No.: 09/047,798

[22] Filed: Mar. 25, 1998

[51] Int. Cl.[7] ............................................. G11C 11/34
[52] U.S. Cl. ............................. 365/185.33; 365/189.05
[58] Field of Search ........................... 365/189.05, 185.33

[56] References Cited

U.S. PATENT DOCUMENTS

| | | | |
|---|---|---|---|
| 4,648,076 | 3/1987 | Schrenk | 365/230 |
| 4,943,962 | 7/1990 | Imamiya et al. | 365/230.08 |
| 5,034,926 | 7/1991 | Taura et al. | 365/218 |
| 5,043,940 | 8/1991 | Harari | 365/168 |
| 5,053,990 | 10/1991 | Kreifels et al. | 364/900 |
| 5,065,364 | 11/1991 | Atwood et al. | 365/185 |
| 5,095,344 | 3/1992 | Harari | 357/23.5 |
| 5,134,589 | 7/1992 | Hamano | 365/238.5 |
| 5,138,580 | 8/1992 | Farrugia et al. | 365/218 |
| 5,155,705 | 10/1992 | Goto et al. | 365/218 |
| 5,163,021 | 11/1992 | Mehrotra et al. | 365/185 |
| 5,168,465 | 12/1992 | Harari | 257/320 |
| 5,172,338 | 12/1992 | Mehrotra et al. | 365/185 |
| 5,270,979 | 12/1993 | Harari et al. | 365/218 |
| 5,283,882 | 2/1994 | Smith et al. | 395/425 |
| 5,303,198 | 4/1994 | Adachi et al. | 365/218 |
| 5,305,276 | 4/1994 | Uenoyama | 365/230.01 |
| 5,337,275 | 8/1994 | Garner | 365/189.01 |
| 5,341,330 | 8/1994 | Wells et al. | 365/185 |

(List continued on next page.)

FOREIGN PATENT DOCUMENTS

| | | | |
|---|---|---|---|
| 0 424 191 A2 | 4/1991 | European Pat. Off. | G06F 11/00 |
| 0 489 204 A1 | 6/1992 | European Pat. Off. | G11C 16/06 |
| 0 501 289 A2 | 9/1992 | European Pat. Off. | G11C 16/06 |
| 0 509 184 A1 | 10/1992 | European Pat. Off. | G11C 16/06 |
| 0 509 330 A2 | 10/1992 | European Pat. Off. | G06F 3/06 |
| 42 14 184 A1 | 11/1992 | Germany | G06F 12/00 |
| 42 15 063 A1 | 11/1992 | Germany | G11C 16/00 |
| 59-45695 | 3/1984 | Japan | G11C 17/00 |
| 62-283496 | 12/1987 | Japan | G11C 17/00 |
| 62-283497 | 12/1987 | Japan | G11C 17/00 |
| 4-332999 | 11/1992 | Japan | G11C 29/00 |
| WO 95 10083 | 4/1995 | WIPO | G06F 12/02 |

OTHER PUBLICATIONS

Kai Hwang & Faye A. Briggs, "Computer Architecture and Parallel Processing," McGraw–Hill, p. 64, 1984.

T. Nozaki et al., "A 1–Mb DDPROM with MONOS Memory Cell for Semiconductor Disk Application," IDDD Journal of Solid–State Circuits, vol. 26, No. 4, pp. 497–501, Apr. 1991.

S. Leibson, "Nonvolatile in–circuit–reprogrammable memories," DDN, Jan. 3, 1991, pp. 89–102.

W. Lahti and D. McCarron, "Store Data in a Flash," BYTD, Nov. 1990, pp. 311–318.

D. Auclair, "Optimal Solid State Disk Architecture For Portable Computers," SunDisk, presented at The Silicon Valley PC Design Conference, Jul. 9, 1991.

S. Mehroura et al., "Serial 9Mb Flash DDPROM for Solid State Disk Applications," 1992 Symposium on VLSI Circuits Digest of Technical Papers, pp. 24–25.

Primary Examiner—David Nelms
Assistant Examiner—M. Tran
Attorney, Agent, or Firm—Haverstock & Owens LLP

[57] ABSTRACT

An improved flash memory system includes a flash array, internal buffer, and internal controller. When data is written from a source block to a destination block, the improved flash memory system temporarily holds this data inside the internal buffer within the flash memory system to save the overhead of sequentially transferring the data out of the flash system and then sequentially returning the data back to the system. Alternatively, the data can be read and concurrently programmed onto the destination block without being written into an internal latch. In use, this improved flash memory system simply transfers the data to be rewritten from the flash array either directly or to the internal buffer. This improved flash memory system locates a new address within this same flash array.

15 Claims, 6 Drawing Sheets

U.S. PATENT DOCUMENTS

| | | | |
|---|---|---|---|
| 5,341,339 | 8/1994 | Wells | 365/218 |
| 5,341,368 | 8/1994 | Henning et al. | 370/58.1 |
| 5,353,256 | 10/1994 | Fandrich et al. | 365/230.03 |
| 5,357,475 | 10/1994 | Hasbun et al. | 365/218 |
| 5,388,083 | 2/1995 | Assar et al. | 365/218 |
| 5,404,485 | 4/1995 | Ban | 395/425 |
| 5,473,569 | 12/1995 | Chwu | 365/218 |
| 5,479,638 | 12/1995 | Assar et al. | 395/430 |
| 5,485,595 | 1/1996 | Assar et al. | 395/430 |
| 5,566,314 | 10/1996 | DeMarco et al. | 395/430 |
| 5,581,723 | 12/1996 | Hasbun et al. | 395/430 |
| 5,640,349 | 6/1997 | Kakinuma et al. | 365/185.33 |
| 5,650,962 | 7/1997 | Arase | 365/185.18 |
| 5,694,538 | 12/1997 | Okazaki et al. | 395/182.13 |
| 5,715,423 | 2/1998 | Levy | 395/430 |

# 6,040,997

FLASH MEMORY LEVELING ARCHITECTURE HAVING NO EXTERNAL LATCH

FIELD OF THE INVENTION

The present invention relates to the field of flash memory devices. More particularly, this invention relates to flash memory devices that do not utilize an external memory device to perform a rewrite operation within the flash memory device.

BACKGROUND OF THE INVENTION

A flash memory device is a non-volatile memory that does not require power such as a battery backup to retain its memory contents. Conventional flash memory devices store charge on a floating gate to represent one of the two binary states, such that lack of stored charge represents the other binary state. A typical flash memory device is configured to perform three basic operations as follows: a read operation, a write operation, and a block erase operation.

Unlike other conventional forms of memory and mass storage, the amount of time necessary to write (program) a bit and also to erase is substantial. Further, a bit cannot simply be changed. The state of a programmed bit must be erased and then reprogrammed. Nevertheless, flash memory is being used as a substitute for rotating magnetic media in computers. With conventional rotating magnetic media as a data or program file is altered simply by rewriting the data. Because of the necessity of an erase before write, data is handled differently on a flash memory.

Flash memory for mass storage is typically arranged in blocks. Each block includes a plurality of addressable sectors, each having a logical block address LBA. In a conventional system, if the data or program stored within a block is to be changed, the data in that source block is first read out of the flash memory and stored in a buffer latch. An erased block in the same flash device is identified as a destination block. Those sectors that are to remain unchanged are then programmed into the corresponding LBAs of the destination block, and the changed data is programmed into the remaining LBAs of the destination block.

Conventional flash memory devices first transfer the data to be moved from the source block (inside the flash array) onto a flash data latch. Subsequently, a controller reads the data stored on the flash of data latch one byte (eight bits) at a time and then sequentially stores each byte of this data onto an external memory device. The flash memory must transmit its data sequentially because it cannot have unlimited input/output pins. Eight bits is exemplary; a flash memory could be constructed with a different number of data input/output pins. Next, the controller sequentially writes each byte of this data that is stored on the external memory device back onto the flash data latch. Finally, the controller issues a program command that writes the data within the plurality of data latches onto the destination block inside the flash array. In conventional flash memory devices, this step of sequentially shifting out the data from the flash data latch onto the external buffer is a time-consuming step. Likewise, this step of sequentially shifting the data from the external memory device back onto the flash data latch is also time-consuming. These mentioned time-consuming steps of sequentially shifting data in and out of the flash memory device degrade the performance of the device.

For example, FIG. 1 illustrates a typical flash memory device 100. A flash array 105 contains electronic circuits which is configured to store the data. A command/control logic 130, an address latch 150, a latch decoder 140, a 528 byte latch 110, a plurality of input/output buffer latches 120, an input/output data bus 145, and an external controller 135 are coupled to the flash array 105. The command/control logic 130 coordinates the timing between the address latch 150, the 528 byte latch 110, the input/output buffer latches 120, and the flash array 105.

In use, when a plurality of predetermined sectors within the flash array 100 are to be transferred to a different block within the same flash array 105, the command/control logic 130 reads the data from the flash memory 105 to the latch 110, and controller 135 sequentially transfers the data from the latch 110 to the external controller 135 into a data buffer 141. After each of the plurality of sectors is read into the data buffer 141, the external controller 135 then proceeds to sequentially write each of the plurality of sectors onto the 528 byte latch from the data buffer 141. After each of the plurality of sectors is written back onto the 528 byte latch, then the plurality of sectors are transferred to a new location in the flash array 105. The steps of sequentially shifting the data out from the flash array 105 to the external controller 135 and then sequentially shifting the data back to the flash array 105 from the external controller 135 are time consuming and needlessly waste resources of the memory device 100.

FIG. 2 illustrates a timing diagram of the flash memory device 100 (FIG. 1) showing the chip enable, address enable, write enable, read enable, and busy indicators. Reference to FIG. 1 will enhance understanding of FIG. 2 and this description thereof. At time T0 the "read" command is given by the external controller 135 and the flash memory device 100 is initialized by activating the chip enable and write enable functions. Next, at time T1 the "source address" is provided and the address enable input is activated to latch the address and the write enable input is also activated. At this stage, the source address is saved in the address latch 150. The ready indicator is activated between times T0 and T2. Between time T2 and time T3, is a transition period and the busy signal is activated. At this time, the data from the flash array 105 is transferred to the latch 110. At time T3, RDY is asserted to indicate that the data is ready to be shifted out by the external controller 135. At time T3 the data to be rewritten is sequentially read out of the flash memory device 100 and the read enable function is activated for each byte of data that is read. Next, at time T4 the "serial in" command is given, and the flash memory device 100 is initialized by activating the command/latch enable and write enable functions. At time T5 the "destination address" is provided to the flash memory and the address enable and the write enable functions are activated to store the destination address in the address latch 150. Next, at time T6 the data is sequentially written back into the 528 byte latch 110 from the external controller 135. The write enable function is activated for each byte of data that is written to the flash memory device 100. Between time T7 and time T8, the "write" command is given. Immediately following the write command function, the write enable function is activated to simultaneously transfer the data residing in the 528 byte latch 110 into the flash array 105 at the destination address. The busy indicator is activated between time T8 and time T9. After time T9, RDY is activated to indicate the end of write.

What is needed is a flash memory device that is configured to rewrite data from one location within a flash array to another location within the same flash array without sequentially shifting this data out of the flash memory onto an external memory device and then sequentially shifting the same data back into the flash memory. What is further needed is a controller that identifies a free memory block within the same flash memory for multiple flash memory systems.

SUMMARY OF THE INVENTION

The present invention comprises an improved flash memory system. This improved flash memory system comprises a flash array, internal buffer, and internal controller. The present invention is preferably configured to quickly and efficiently rewrite data stored in one location within the flash array to another location within the same flash array without utilizing an external memory device. The present invention is also configured to search for free memory within the same flash array wherein this free memory serves as the destination address. During this rewrite process, instead of sequentially shifting data to be re-written outside the flash memory system and onto an external memory device, the improved flash memory system temporarily holds this data inside the internal buffer within the flash memory system. Additionally, instead of writing this data to be rewritten from the external memory device back into the internal buffer, the improved flash memory system already holds this data in the internal buffer. This improved flash memory system eliminates the extra overhead of saving the data to be rewritten onto the external memory device.

In use, this improved flash memory system simply transfers the data to be rewritten from the flash array to the internal buffer. Then, this improved flash memory system locates a new address where there is a free block of memory within this same flash array. Finding the free block of memory within the same flash array is important for multiple flash memory array systems. Next, the flash memory system transfers the data from the internal buffer back onto the flash array at the new address location. In this way, the data never leaves the flash memory integrated circuit. In a multi-flash system the controller preferably attempts to move data from a source block to a destination block on the same flash memory integrated circuit in order to take advantage of this performance improvement.

Alternatively, the controller can be configured to provide a source and destination address and simply control the reading and concurrent programming of the unchanged data from the appropriate LBAs in the source block to the destination block.

The improved flash memory system rewrites data within the flash memory system more efficiently. The present invention minimizes the number of steps needed to rewrite data within the same flash memory device. Further, the present invention does not sequentially shift the data into the external memory device.

It is an object of the present invention to minimize the number of steps and the amount of time needed for a flash memory system to rewrite data within the same flash memory system. It is another object of the present invention to rewrite data within the flash memory system without utilizing an external memory device.

DETAILED DESCRIPTION OF THE PRESENT INVENTION

The present invention comprises both a system for and a method of rewriting data within the same flash memory system without utilizing an external memory device. The system preferably comprises a flash array, a plurality of internal buffers, and an internal controller.

Figure 1:
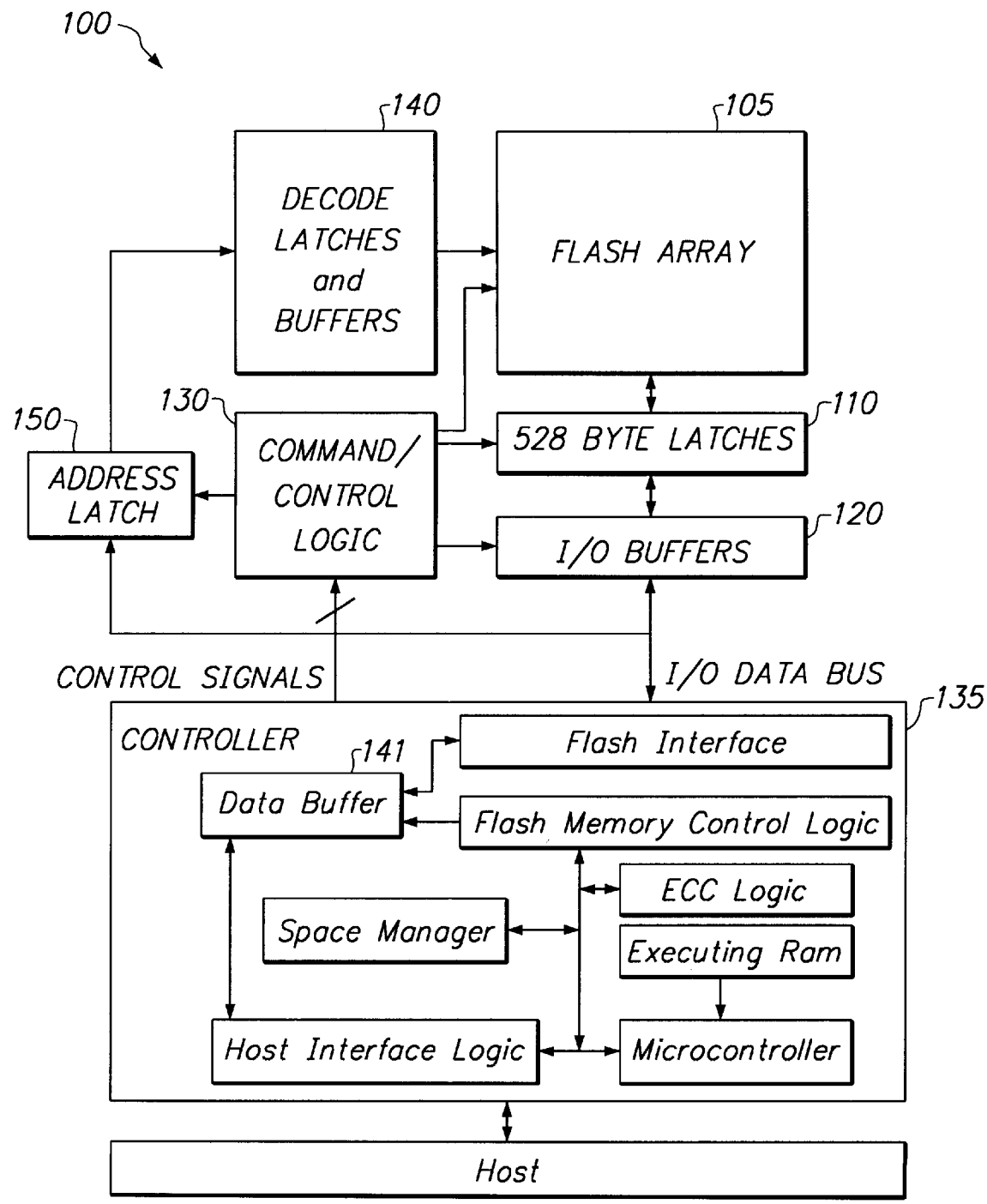
FIG. 1 illustrates a block diagram of a conventional flash memory device.
Figure 2:
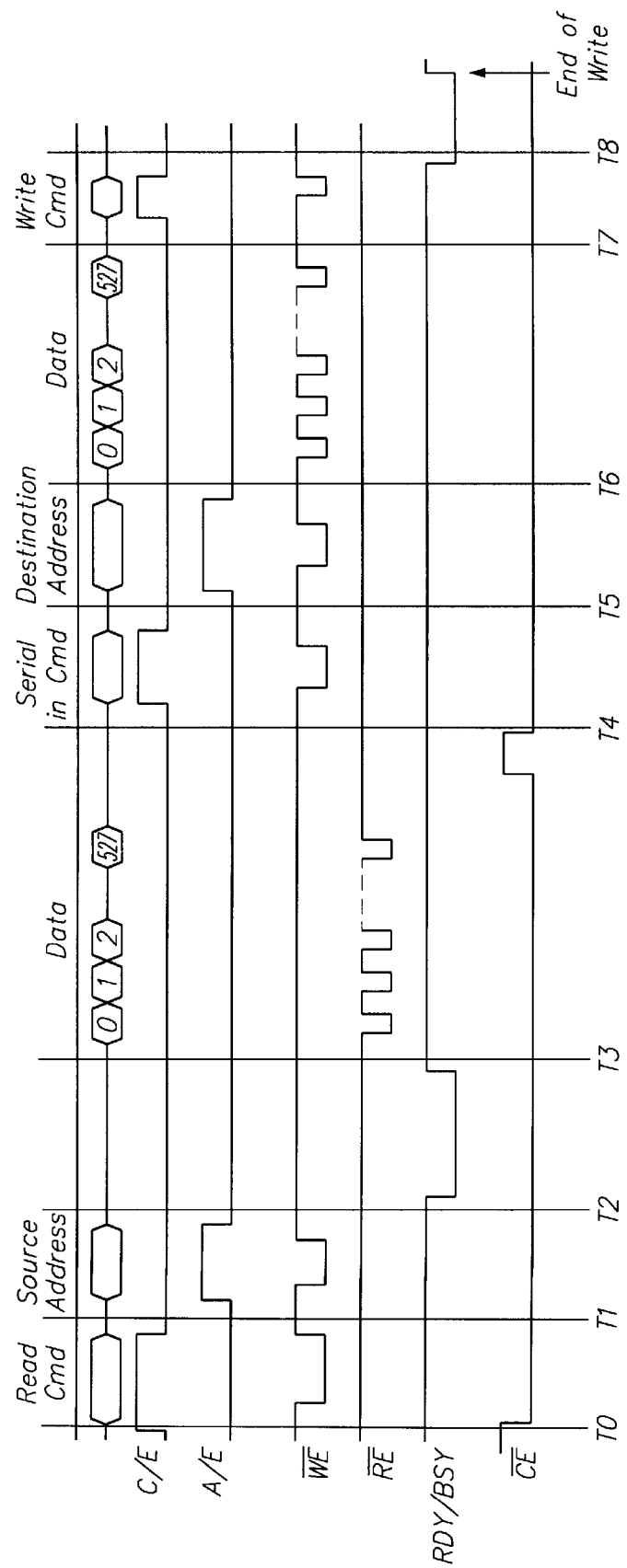
FIG. 2 illustrates a timing diagram of the flash memory device shown in FIG. 1.
Figure 3:
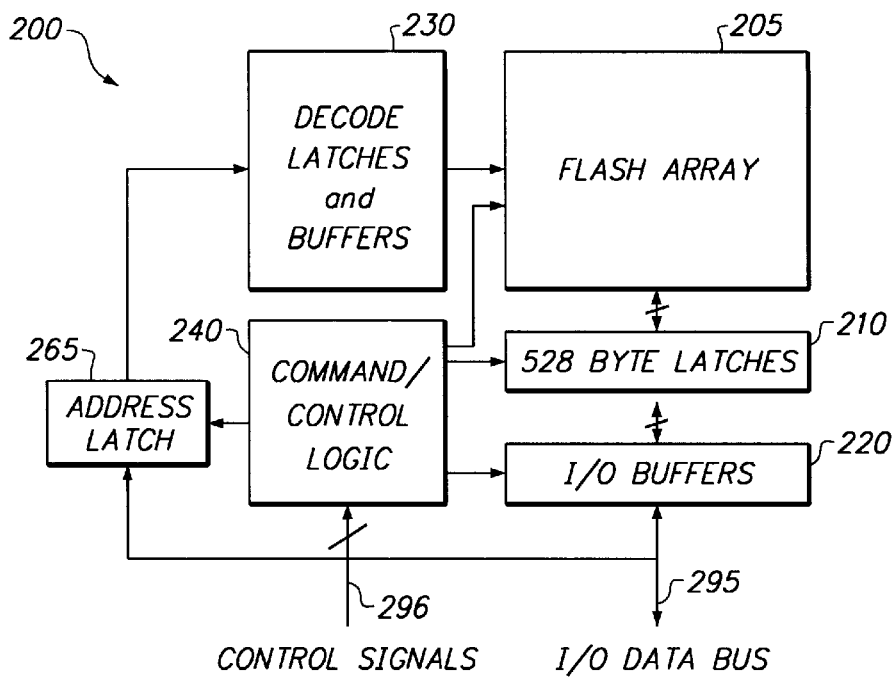
FIG. 3 illustrates a block diagram of a first embodiment of the present invention.

FIG. 3 illustrates a block diagram of a flash memory system 200. The flash memory system 200 comprises the following: internal 528 byte latch 210, input/output buffers 220, decoder for latches and buffers 230, flash array 205, command/control logic 240, and address latch 265. The command/control logic 240 is configured to be coupled to the flash array 205, the internal 528 byte latch 210, the input/output buffers 220, and the address latch 265.

The command/control logic 240 preferably provides the control signals to the flash array 205, the internal 528 byte latch 210, the input/output buffers 220, and the address latch 265.

A bi-directional bus is coupled between the flash array 205 and the internal 528 byte latch 210. A bi-directional bus is also data coupled between the internal 528 byte latch 210 and the input/output buffers 220. Further, there is a bi-directional bus between the input/output buffers 220 and an input/output data bus 295 of the external controller 135. A data bus provides data transfers from the input/output buffers 220 to the address latch 265. Further, a data bus also allows data to flow from the address latch 265 to the decoder for latches and buffers 230. Finally, a data bus allow data to flow from the decoder for latches and buffers 230 to the flash array 205.

According to the flash memory system 200, includes devices to perform several basic operations for rewriting data within the flash array 205. First, the command/control logic 240 preferably receives a read command from the external system via the external command bus 296 and in response sends a "read" command to the flash array 205. As a result, the data to be rewritten is simultaneously transferred into the internal 528 byte latch 210. In contrast to prior art systems, this data is not sequentially shifted out of the flash memory system 200 via the input/output data bus 295. Next, the external controller 135 preferably sends a "new program" command which is now designed into the command/control logic 240 and the destination address to the address latch 265. The external controller 135 preferably searches only within the flash array 205 for an unused block location for this destination address. Finally, the data to be rewritten which was initially stored in the internal 528 byte latch 210 is programmed back into the flash array 205 at the location of the destination address as stored in the address latch 265.

The flash memory system 200 eliminates the need to sequentially shift the data to be rewritten out of the flash memory system 200 and onto an external memory device. Because the data to be rewritten remains on the internal 528 byte latch 210, the flash memory system 200 does not need to shift the data out to an external memory device. As a result, the flash memory system 200 rewrites data within the flash array 205 more quickly and efficiently when compared to other flash memory systems which temporarily store the data to be rewritten in an external memory device.

Figure 4:
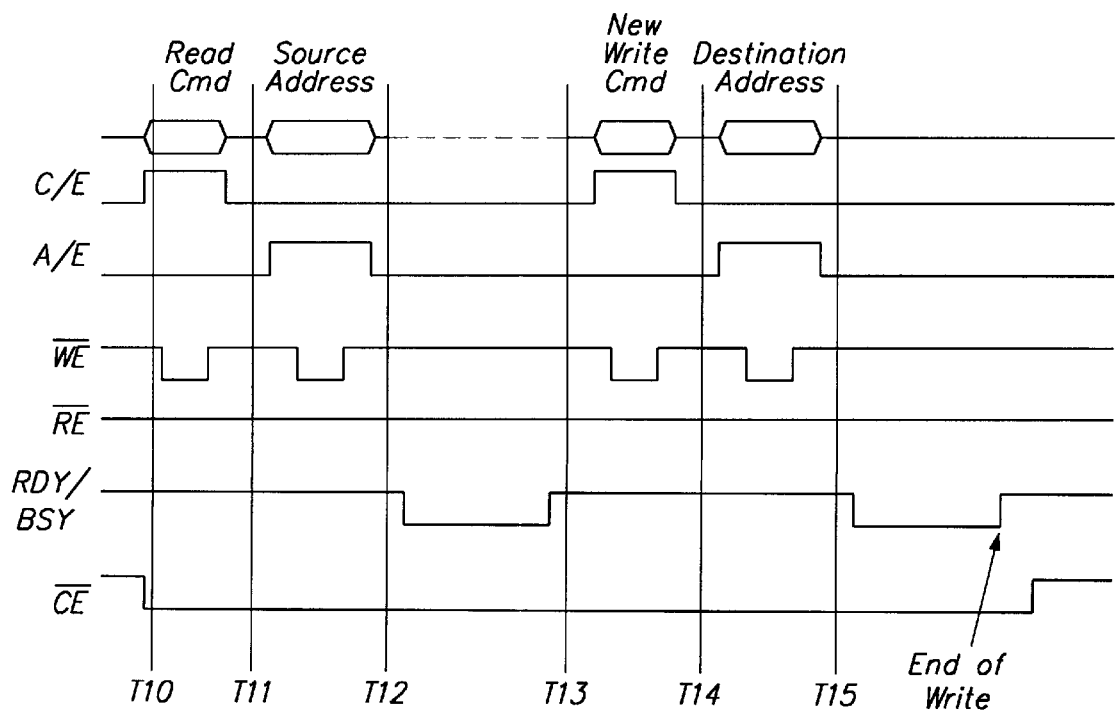
FIG. 4 illustrates a timing diagram of the first embodiment shown in FIG. 3.

FIG. 4 illustrates a timing diagram of the flash memory device 200 (FIG. 3) showing the command latch enable, address enable, write enable, read enable, and busy indicators. Reference to FIG. 3 will enhance understanding of FIG. 4 and this description thereof. This timing diagram is an example which demonstrates the required steps to successfully rewrite data within the flash array 205 of the memory device 200. At time T10 the "read" command is given by the external controller 135 and the flash memory device 200 is initialized by activating the chip enable and write enable functions. Next, at time T11 the "source address" is provided and the address enable and write enable signals are activated. At this stage, the source address is saved in the address latch 265. The busy indicator is activated between times T10 and T12. Between time T12 and time T13, is a transition period. At this time, the memory 200 device asserts RDY/BSY to indicate the end of read cycle to the external controller 135. At T13, the external controller 135 issues a new write command with the destination address to the memory device 200. The command/control logic 240 recognizes this new command and initiates the write function from the data latch 210 to the flash array 205. At time T14 the "destination address" is provided given and the address enable and the write enable functions are activated to store the destination address in the address latch 265. The busy indicator is activated between time T13 and time T15. It is important to note that sequentially reading the data out of the memory device 200 and sequentially writing the data back onto the flash array 205 does not occur in the memory device 200.

Figure 5:
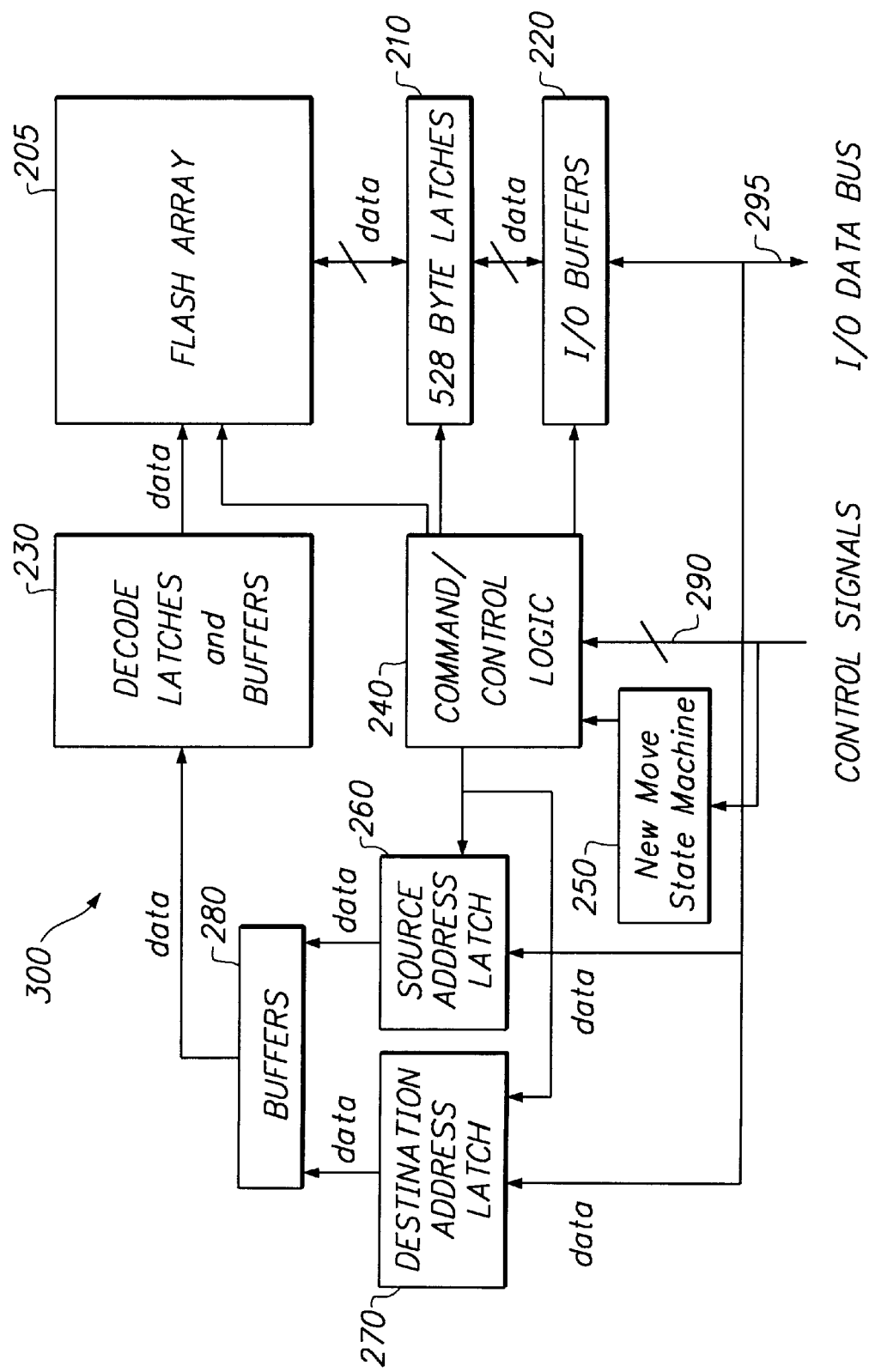
FIG. 5 illustrates a block diagram of a second embodiment of the present invention.

FIG. 5 illustrates a block diagram of a flash memory system 300. The flash memory system 300 is similar to the flash memory system 200 described above and shown in FIG. 3. For the sake of simplicity and clarity, the internal 528 byte latch 210, the input/output buffers 220, the decoder for latches and buffers 230, the flash array 205, and the command/control logic 240 share common reference numbers. The flash memory system 300 comprises the following: the internal 528 byte latch 210, the input/output buffers 220, the decoder for latches and buffers 230, the flash array 205, the command/control logic 240, a state machine 250, a source address latch 260, a destination address latch 270, and secondary buffers 280. The command/control logic 240 is configured to be coupled to the flash array 205, the internal 528 byte latch 210, the input/output buffers 220, the state machine 250, the source address latch 260, and the destination address latch 270.

The external controller 135 provides a new command to the memory device 300 having a source and destination address where the command/control logic 240 provides the control signals to the flash array 205, the internal 528 byte latch 210, the input/output buffers 220, the source address latch 260, and the destination address latch 270. The state machine 250 and outside control lines 290 preferably provide input to the command/control logic 240.

There are data lines flowing both ways between the flash array 205 and the internal 528 byte latch 210. There are also data lines flowing both directions between the internal 528 byte latch 210 and the input/output buffers 220. Further, there are data lines flowing both directions between the input/output buffers 220 and an input/output data bus 295. A data line flows from the data bus 295 to the source address latch 260 and the destination address latch 270. From the secondary buffers 280, a data line flows to the decoder for latches and buffers 230. Finally, a data line flows from the decoder for latches and buffers 230 to the flash array 205. The state machine 250 controls the transfer of the data to be re-written directly into the destination address without first being stored in the internal latch.

According to the flash memory system 300, there are several basic steps involved with rewriting data within the flash array 205. First, the external controller 135 sends a new "move" command to the memory device 300. A source address and a destination address are provided to the flash array 205 by the external controller 135 and latched into the two address latches, the source address latch 260 and the destination address latch 270, respectively. Next, the state machine 250 communicates with the command/control logic 240. As a result, the command/control logic 240 directs the data to be rewritten from the source address on the flash array 205 to the destination address.

The flash memory system 300 eliminates the need to sequentially shift the data to be rewritten out of the flash memory system 300 and into an external memory device. Because the data to be rewritten remains on the internal 528 byte latch 210, the flash memory system 300 does not need an external memory device. As a result, the flash memory system 300 rewrites data within the flash array 205 more quickly and efficiently when compared to other flash memory systems which temporarily store the data to be rewritten in an external memory device. The flash memory system 300 also eliminates the overhead of the external controller 135 by not waiting for the flash array 205 to finish the read function before sending the write command utilized for the destination address to the flash array 205.

Figure 6:
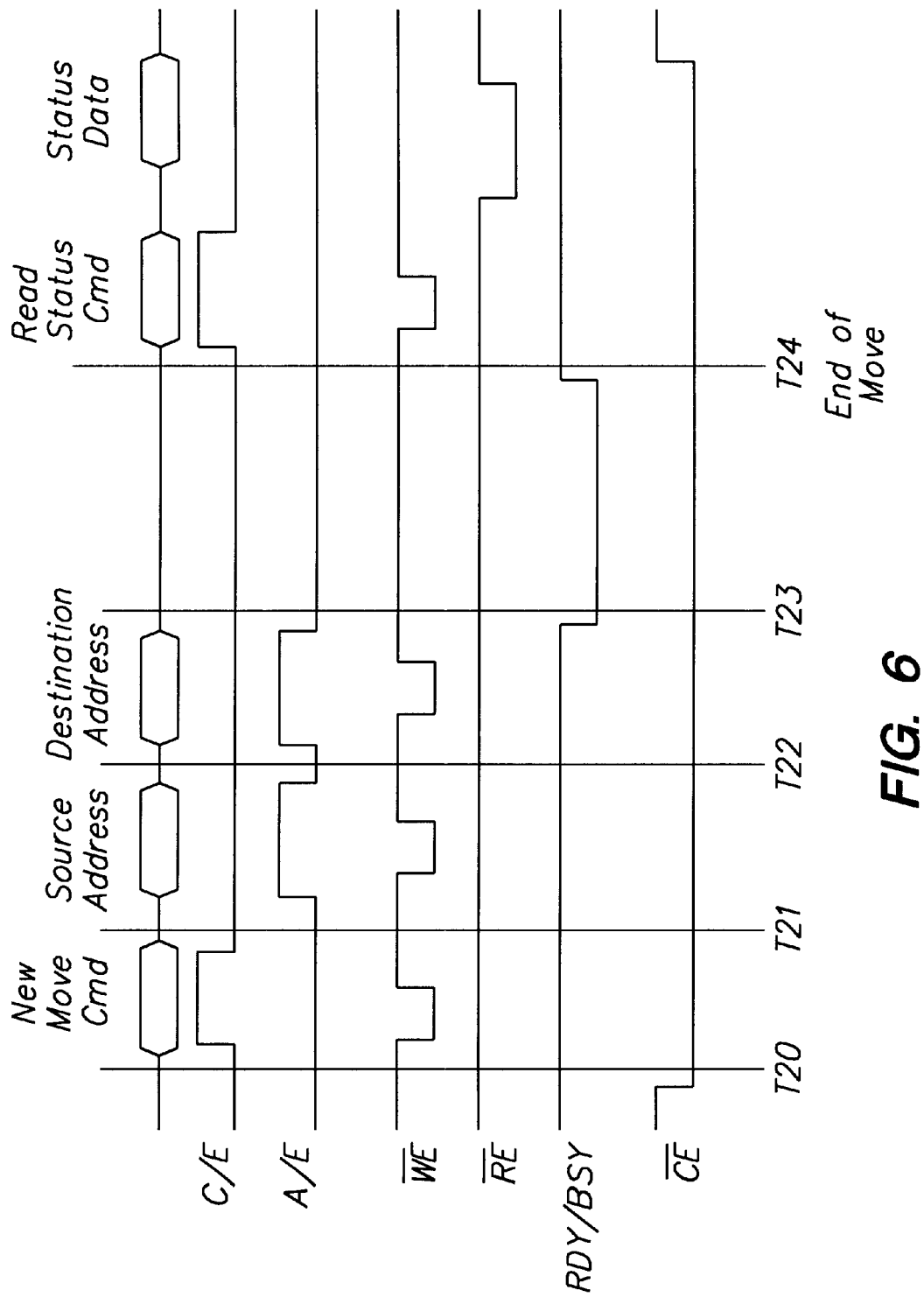
FIG. 6 illustrates a timing diagram of the second embodiment shown in FIG. 5.

FIG. 6 illustrates a timing diagram of the flash memory device 300 (FIG. 5) showing the chip enable, address enable, write enable, read enable, and busy indicators. Reference to FIG. 5 will enhance understanding of FIG. 6 and this description thereof. This timing diagram is an example which demonstrates the required steps to successfully rewrite data within the flash array 205 of the memory device 300. At time T20 the new "move" command is given by the external controller 135. Next, at time T21 the "source address" is provided and the address enable and write enable signals are activated. At this stage, the source address is saved in the source address latch 260. At time T22 the "destination address" is provided and the address enable and the write enable functions are activated to store the destination address in the destination address latch 270. The busy indicator is activated between times T20 and T23. It is important to note that sequentially reading the data out of the memory device 300 and sequentially writing the data back onto the flash array 205 does not occur in the memory device 300. In this case, the new-move state machine 250 within the memory device 300 will eliminate the overhead of the external controller 135 to monitor the RDY/BSY line to see the end of read operation and send the new write command and destination address.

Figure 7:
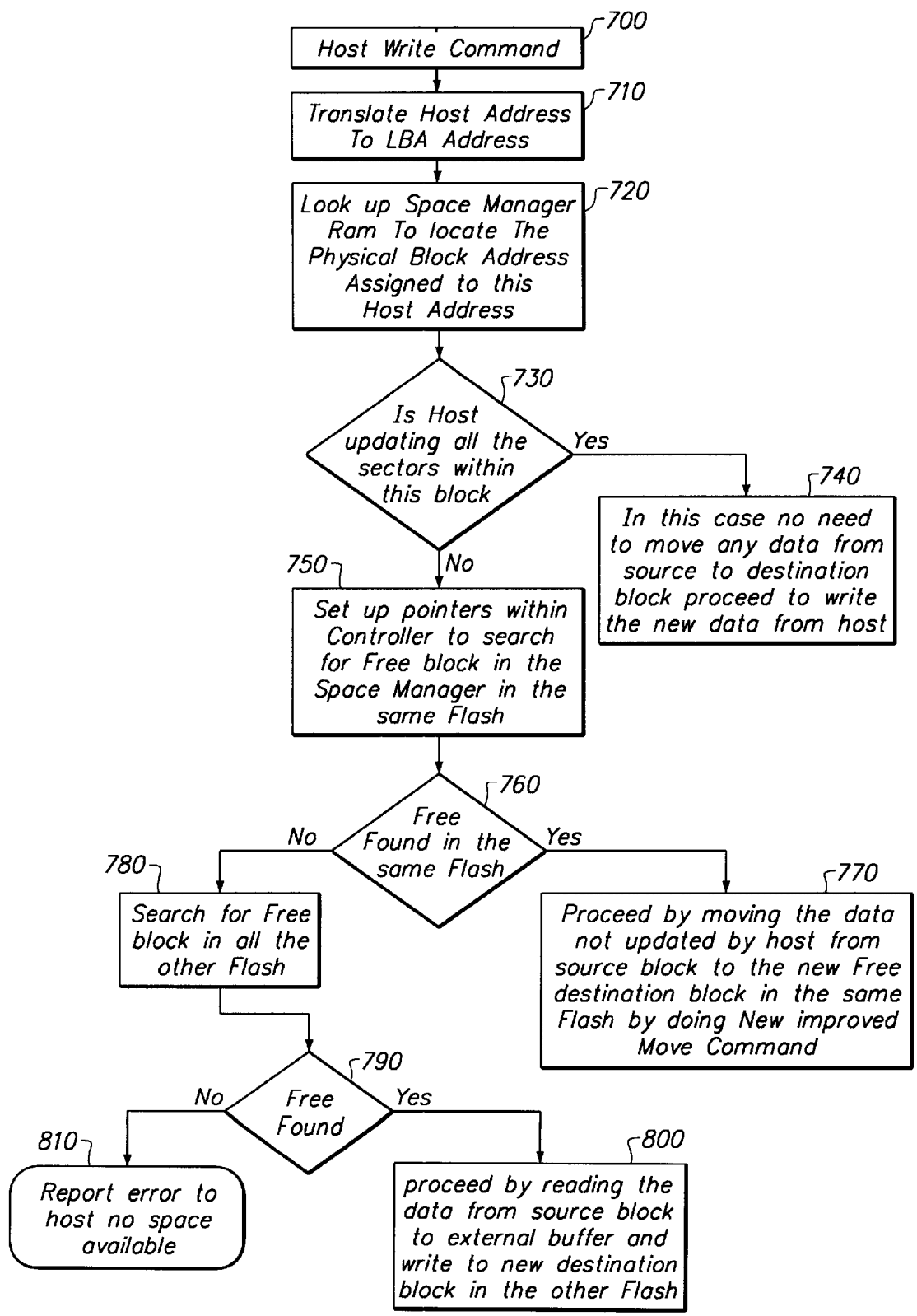
FIG. 7 illustrates a flowchart showing steps performed by the external controller.

For the present invention to rewrite data from a source location to a destination location without sequentially shifting this data out of the flash memory and onto an external memory device and then sequentially shifting this data back on the flash memory, the source location and the destination location are preferably located on the same flash array. FIG. 7 illustrates a flowchart describing the steps of the external controller 135 to identify free memory blocks within the same flash array 205 for multiple flash memory systems. At step 700, the host receives the write command. Next, at step 710, the host address is translated to the logical block address. At step 720, the space manager RAM locates the physical block address assigned to the host address. At step 730, the external controller 135 asks if the host is updating all the sectors within this block.

If the host is updating all the sectors within the memory block, then the controller 135 proceeds to step 740 where there is no need to move any data. If the host is not updating all the sectors in the desired block, then the controller 135 proceeds to step 750 where the controller 135 searches for a free memory block in the space manager RAM within the same flash array 205. After step 750, step 760 checks whether a free memory block is available in the same flash array 205. If a free memory block is found in step 760, then the external controller 135 proceeds to step 770. At step 770, the New Improved Move Command is executed and the not updated data is moved from the source block to the new free memory block (destination block.)

However, if there is no free memory found in the same flash array 205, the external controller 135 proceeds to step 780. At step 780, the external controller 135 searches for a free memory block in all other flash arrays. Next, at step 790, if a free memory block is found then the external controller 135 reads the data from the source block to the external buffer and writes this data to the new destination block in another flash array as shown in step 800. If a free memory block is not found in step 790, the external controller 135 reports an error to the host and notifies the host that no space is available as shown in step 810.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the device of the present invention could be implemented in several different ways and the embodiments disclosed above are only exemplary of the preferred embodiment and the alternate embodiments of the invention and is in no way a limitation.

What is claimed is:

1. A flash memory system comprising:
   a. a flash array for storing data;
   b. a plurality of internal latches coupled to the flash array for temporarily holding the data;
   c. a controller coupled to the flash array and the plurality of internal latches configured to transfer the data stored in a source address of the flash array to the plurality of internal latches and then directly transferring the data, to a destination address in the flash array without utilizing an external memory device, wherein the external memory device is external from the flash memory system; and
   d. a locator device configured to search within the flash array for a free memory block for use as the destination address.

2. The flash memory system according to claim 1 wherein the plurality of internal latches are capable of simultaneously loading the data.

3. A flash memory device comprising:
   a. a flash array having a first memory block and a second memory block wherein the first memory block is configured for storing data;
   b. a plurality of internal latches configured for temporarily holding the data; and
   c. a controller coupled to the flash array and the plurality of internal latches wherein the controller is configured to transfer the data from the first memory block to the second memory block by temporarily holding the data within the plurality of internal latches and then transferring the data from the plurality of internal latches to the second memory block.

4. The flash memory device according to claim 3 further comprising a locator device configured to search within the flash array for a free memory block to be used as the second memory block.

5. A flash memory device comprising:
   a. a flash array having a source memory block and a destination memory block both configured for storing data;
   b. a source address latch for holding a source address belonging to the source memory block and a destination address latch for holding a destination address belonging to the destination memory block; and
   c. a state machine coupled to the flash array, the source address latch, and the destination address latch for reading the data stored in the source memory block and then programming the data to the destination memory block.

6. The flash memory device according to claim 5 further comprising a locator device configured for searching for a free memory block within the flash array for use as the destination memory block.

7. A method of transferring data from a first memory block to a second memory block within a flash memory device formed on an integrated circuit without utilizing an external buffer, comprising the following steps:
   a. reading the data from the first memory block;
   b. temporarily holding the data from the first memory block inside a plurality of internal latches, wherein the plurality of internal latches are located within the integrated circuit;
   c. writing the data originating from the first memory block and held within the plurality of internal latches to the second memory block; and
   d. receiving an address of the second memory block.

8. The method according to claim 7 further comprising the step of searching for free memory for use as the second memory block wherein the free memory is located in a same flash array as the first memory block.

9. The method according to claim 8 further comprising the step of locating a free memory block within the flash array for use as the destination memory block.

10. A method of transferring data from a source memory block to a destination memory block, wherein the source memory block and the destination memory block are both within a flash array, the method comprising the following steps:
    a. transferring a source address belonging to the source memory block to a source address latch and transferring a destination address belonging to the destination memory block to a destination address latch;
    b. temporarily storing the data from the source memory block into a plurality of internal latches located within a flash memory device; and
    c. writing the data stored in the plurality of internal latches to the destination memory block,
    wherein the data stays within the flash memory device.

11. A method of transferring data from a source memory block to a destination memory block, wherein the source memory block and the destination memory block are both within a flash array formed on an integrated circuit, the method comprising the following steps:

a. reading the data from the source memory block;

b. programming the data directly onto the destination memory block wherein the data does not leave the integrated circuit during this operation; and c. locating a free memory block within the flash array for use as the destination memory block.

12. An improved flash memory device comprising:

a. a flash array for storing data wherein the flash array includes a source block and a destination block;

b. a plurality of latches located within the flash memory device and coupled to the flash array for temporarily holding the data; and c. a controller coupled to the flash array and the plurality of latches for reading selected data stored within the source block into the plurality of latches and further writing the selected data from the plurality of latches to the destination block.

13. A method of updating a original data block with an updated version of the data block in a flash memory having a plurality of flash integrated circuits, the method comprising the steps of:

a. identifying an empty physical block address in a same flash integrated circuit for storing an updated version of the data block;

b. determining whether any portions of the original data block will be retained;

c. receiving the updated version of the data block from a host and storing it at the empty physical block address if no portions of the original data block will be retained;

d. moving those portions of the original data block which will be retained to the empty physical block address in the same flash memory integrated circuit without transferring such data out of the same flash memory integrated circuit.

14. The method according to claim 13 wherein the method further comprises searching for a free block of data in another flash memory integrated circuit in the event that no empty blocks are present in the same flash memory integrated circuit.

15. The method according to claim 14 wherein the method further comprises providing notification to the host in the event there is no free block of data in another flash memory integrated circuit.

* * * * *